US012700467B2

(12) United States Patent
Paul et al.

(10) Patent No.: US 12,700,467 B2
(45) Date of Patent: Aug. 4, 2026

(54) SECURE ANTI-FUSE ONE TIME PROGRAMMABLE BIT CELL DESIGN

(71) Applicant: QUALCOMM Incorporated, San Diego, CA (US)

(72) Inventors: Abhijeet Paul, Escondido, CA (US); Mishel Matloubian, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 188 days.

(21) Appl. No.: 18/187,993

(22) Filed: Mar. 22, 2023

(65) Prior Publication Data

US 2024/0321370 A1 Sep. 26, 2024

(51) Int. Cl.
| | |
|---|---|
| *G11C 17/00* | (2006.01) |
| *G11C 17/16* | (2006.01) |
| *H10B 20/25* | (2023.01) |
| *H10W 20/49* | (2026.01) |

(52) U.S. Cl.
CPC ........... *G11C 17/165* (2013.01); *H10B 20/25* (2023.02); *H10W 20/491* (2026.01)

(58) Field of Classification Search
CPC ....... G11C 17/165; G11C 17/16; G11C 17/18; H01L 23/5252; H10B 20/25
USPC ......................................................... 365/96
See application file for complete search history.

(56) References Cited

U.S. PATENT DOCUMENTS

| | | | | | |
|---|---|---|---|---|---|
| 6,570,212 | B1 * | 5/2003 | Mehta | .................... | H10B 41/30 |
| | | | | | 257/314 |
| 6,762,453 | B1 * | 7/2004 | Simacek | ................ | H10B 41/30 |
| | | | | | 257/318 |
| 6,911,694 | B2 * | 6/2005 | Negoro | .............. | H10D 84/0181 |
| | | | | | 257/E29.256 |
| 11,152,382 | B2 * | 10/2021 | Ju | ........................ | H10D 64/512 |
| 11,362,097 | B1 | 6/2022 | Chern | | |
| 11,600,663 | B2 * | 3/2023 | Han | ..................... | H10D 62/112 |
| 2002/0117720 | A1 * | 8/2002 | Lee | .......................... | H10D 1/66 |
| | | | | | 257/532 |

(Continued)

FOREIGN PATENT DOCUMENTS

CN 115312492 A 11/2022

OTHER PUBLICATIONS

International Search Report and Written Opinion—PCT/US2024/018374—ISA/EPO—Sep. 19, 2024.

(Continued)

*Primary Examiner* — Tha-O H Bui
(74) *Attorney, Agent, or Firm* — Gerald P. Joyce, III

(57) ABSTRACT

Disclosed are secure anti-fuse one-time programmable (OTP) bit cells. In an aspect, an OTP bit cell includes a P– well comprising an N+ region and a P+ region, a first contact electrically coupled to the N+ region of the P– well, a second contact electrically coupled to the P+ region of the P– well, an insulating layer disposed over a portion of the N+ region, a portion of the P– well, and a portion of the P+ region, a gate structure disposed over the insulating layer, and a third contact electrically coupled to the gate structure. In an unprogrammed mode, the insulating layer creates a high resistance between the third contact and the second contact, and in a programmed mode, a rupture in the insulating layer creates a low resistance between the third contact and the second contact.

18 Claims, 9 Drawing Sheets

(56) References Cited

U.S. PATENT DOCUMENTS

2021/0272642 A1    9/2021  Noguchi et al.

OTHER PUBLICATIONS

Partial International Search Report—PCT/US2024/018374—ISA/
EPO—Jun. 25, 2024.
Wolf S., "Chapter 13. Polycides and Salicides of TiSi2, CoSi2, and
NiSi", Silicon Processing for the VLSI ERA, Lattice Press, Sunset
Beach, CA, US, Jan. 2002, pp. 603-638, XP009148370, The whole
document.

* cited by examiner

200

300

900

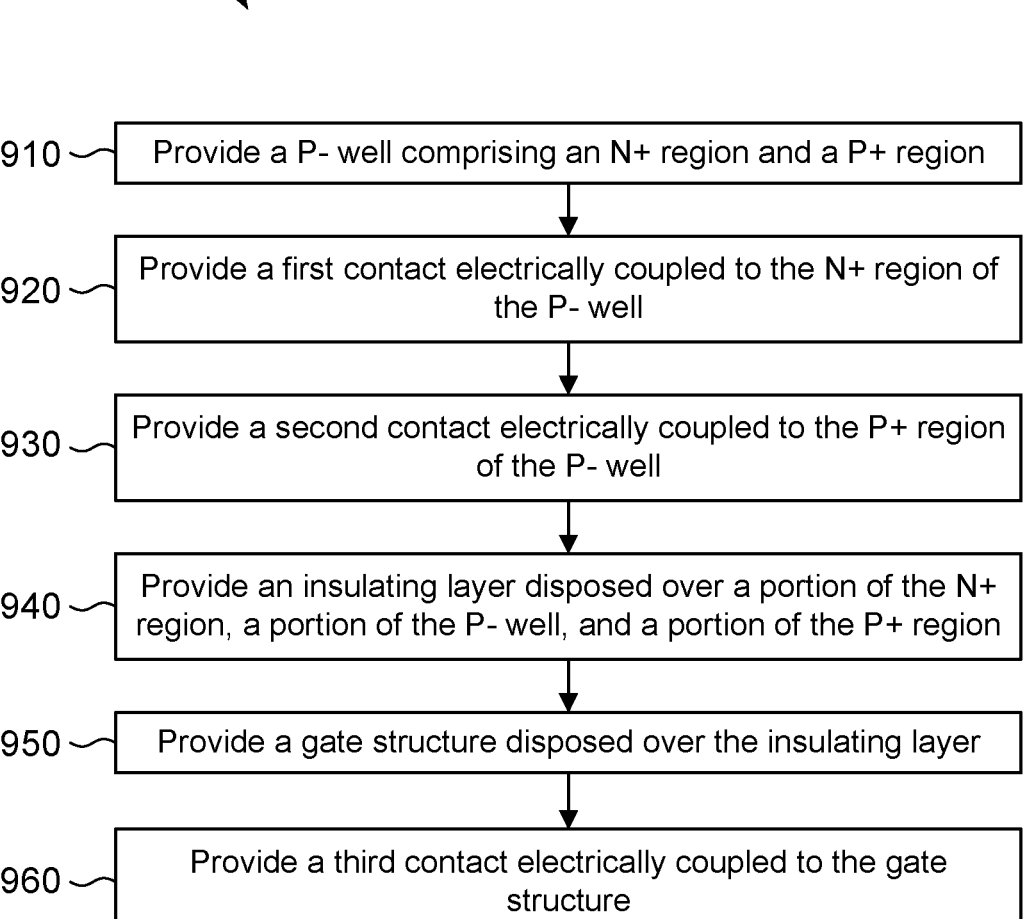

910 — Provide a P- well comprising an N+ region and a P+ region

920 — Provide a first contact electrically coupled to the N+ region of the P- well 930 — Provide a second contact electrically coupled to the P+ region of the P- well 940 — Provide an insulating layer disposed over a portion of the N+ region, a portion of the P- well, and a portion of the P+ region 950 — Provide a gate structure disposed over the insulating layer 960 — Provide a third contact electrically coupled to the gate structure

1010 — Provide a first substrate layer

1020 — Provide an insulating layer disposed over the first substate layer

1030 — Provide a gate structure disposed over the insulating layer

1040 — Provide a first contact electrically coupled to the gate structure

1050 — Provide a second contact coupled to the first substrate layer and in direct contact with the insulating layer

SECURE ANTI-FUSE ONE TIME PROGRAMMABLE BIT CELL DESIGN

BACKGROUND OF THE DISCLOSURE

1. Field of the Disclosure

Aspects of the disclosure relate generally to one-time programmable (OTP) memory cells.

2. Description of the Related Art

One-time programmable (OTP) memory cells have multiple applications in the integrated circuit (IC) industry, where they are used as programmable read only memories (ROMs), used for storing program or device settings in a secure manner such that the settings cannot be tampered with, storing tuning parameters for phase locked loops, and the like. Existing OTP designs that use a polysilicon ("poly") electrical fuse (efuse) have relatively low density and can be reprogrammed (or corrupted) by causing some of its layers to reflow, reducing the security of conventional OTP designs.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, a one-time programmable (OTP) bit cell includes a P– well comprising an N+ region and a P+ region; a first contact electrically coupled to the N+ region of the P– well; a second contact electrically coupled to the P+ region of the P– well; an insulating layer disposed over a portion of the N+ region, a portion of the P– well, and a portion of the P+ region; a gate structure disposed over the insulating layer; and a third contact electrically coupled to the gate structure.

In an aspect, an OTP bit cell includes a first substrate layer; an insulating layer disposed over the first substrate layer; a gate structure disposed over the insulating layer; a first contact electrically coupled to the gate structure; and a second contact coupled to the first substrate layer and in direct contact with the insulating layer.

In an aspect, a method of fabricating an OTP bit cell includes providing a P– well comprising an N+ region and a P+ region; providing a first contact electrically coupled to the N+ region of the P– well; providing a second contact electrically coupled to the P+ region of the P– well; providing an insulating layer disposed over a portion of the N+ region, a portion of the P– well, and a portion of the P+ region; providing a gate structure disposed over the insulating layer; and providing a third contact electrically coupled to the gate structure.

In an aspect, a method of fabricating an OTP bit cell includes providing a first substrate layer; providing an insulating layer disposed over the first substrate layer; providing a gate structure disposed over the insulating layer; providing a first contact electrically coupled to the gate structure; and providing a second contact coupled to the first substrate layer and in direct contact with the insulating layer.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of various aspects of the disclosure and are provided solely for illustration of the aspects and not limitation thereof.

FIG. 9 is a flowchart of an example process associated with fabricating a secure anti-fuse OTP bit cell according to aspects of the disclosure.

Figure 1A:
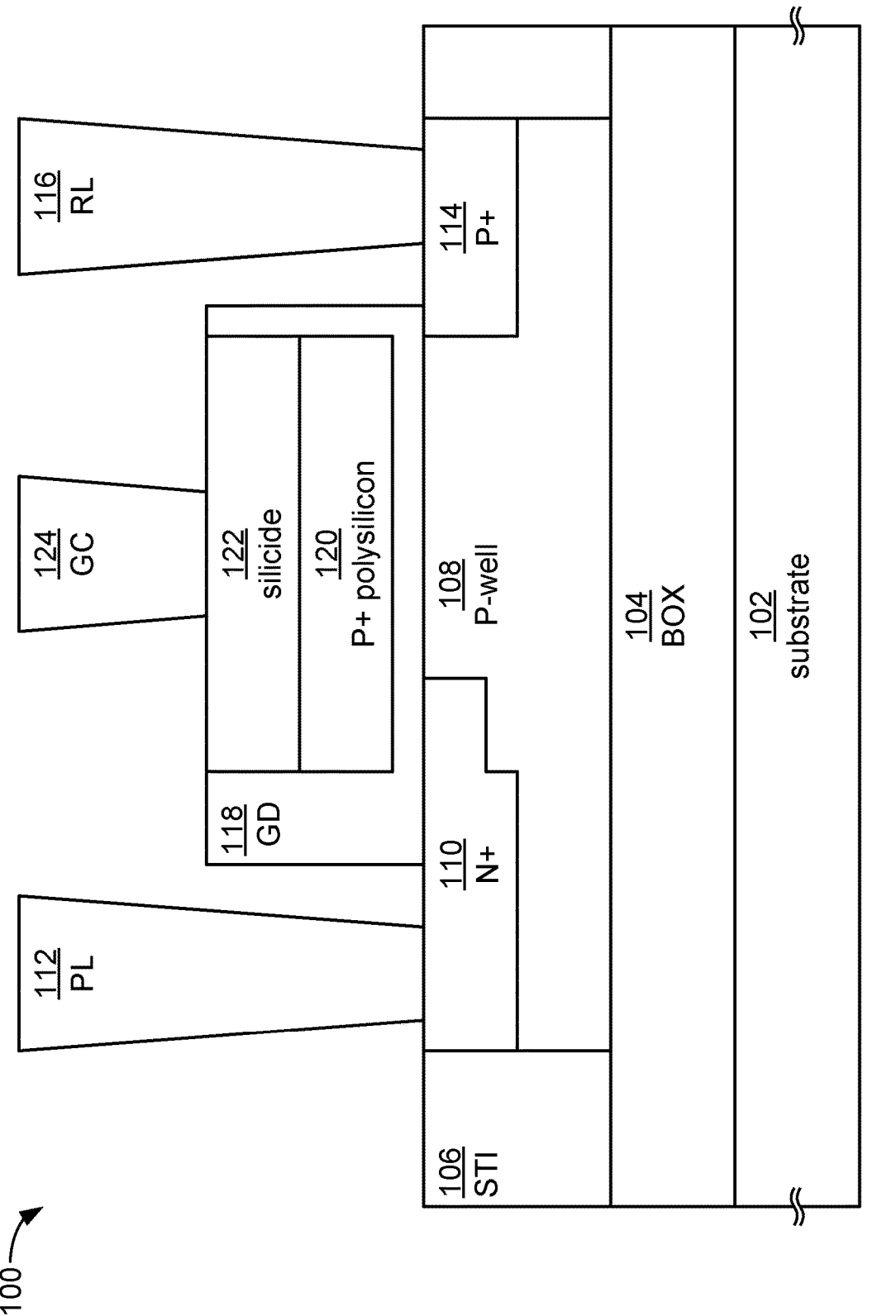
FIG. 1A is a cross-section of a secure anti-fuse OTP bit cell in an unprogrammed state according to aspects of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Disclosed are secure anti-fuse one-time programmable (OTP) bit cells. In an aspect, an OTP bit cell includes a P– well comprising an N+ region and a P+ region, a first contact electrically coupled to the N+ region of the P– well, a second contact electrically coupled to the P+ region of the P– well, an insulating layer disposed over a portion of the N+ region, a portion of the P– well, and a portion of the P+ region, a gate structure disposed over the insulating layer and comprising P+ polysilicon, and a third contact electrically coupled to the gate structure. In an unprogrammed mode, the insulating layer creates a high resistance between the third contact and the second contact, and in a programmed mode, a rupture in the insulating layer creates a low resistance between the third contact and the second contact.

Aspects of the disclosure are provided in the following description and related drawings directed to various examples provided for illustration purposes. Alternate aspects may be devised without departing from the scope of the disclosure. Additionally, well-known elements of the disclosure will not be described in detail or will be omitted so as not to obscure the relevant details of the disclosure.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the disclosure" does not require that all aspects of the disclosure include the discussed feature, advantage or mode of operation.

Those of skill in the art will appreciate that the information and signals described below may be represented using any of a variety of different technologies and techniques. For example, data, instructions, commands, information, signals, bits, symbols, and chips that may be referenced throughout the description below may be represented by voltages, currents, electromagnetic waves, magnetic fields or particles, optical fields or particles, or any combination thereof, depending in part on the particular application, in part on the desired design, in part on the corresponding technology, etc.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, the sequence(s) of actions described herein can be considered to be embodied entirely within any form of non-transitory computer-readable storage medium having stored therein a corresponding set of computer instructions that, upon execution, would cause or instruct an associated processor of a device to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

One-time programmable (OTP) memory cells have multiple applications in the integrated circuit (IC) industry, where they are used as programmable read only memories (ROMs), used for storing program or device settings in a secure manner such that the settings cannot be tampered with, storing tuning parameters for phase locked loops, and the like. Existing OTP designs that use a polysilicon ("poly") electrical fuse (efuse) have relatively low density and can be reprogrammed (or corrupted) by causing some of its layers to reflow, which can corrupt the data. This vulnerability of conventional OTP designs makes them insecure. Thus, there is a need for high-density, un-reprogrammable OTP designs.

Accordingly, disclosed are secure anti-fuse one-time programmable (OTP) bit cells having a P– well P+ capacitor and that are programmed using an oxide fusing method. In an unprogrammed state, the capacitor provides a very high resistance (e.g., megaohms) between two terminals of the OTP bit cell, and in a programmed state, a break in the capacitor dielectric causes a very low resistance (e.g., kiloohms) across the two terminals. The P+ gate on a P– well also provides control over the oxide fusing area and the substrate connection area. The OTP bit cells disclosed herein are not susceptible to reprogramming or corruption due to temperature reflow because the dielectric breakdown is destructive and cannot be repaired, making the OTP bit cells disclosed herein very secure.

FIG. 1A is a cross-section of a secure anti-fuse OTP bit cell 100 (which may be referred to herein simply as "bit cell 100") according to aspects of the disclosure. In the example shown in FIG. 1A, a substrate 102 (e.g., silicon) is topped with a buried oxide layer (BOX) 104. Shallow trench isolation (STI) 106 electrically isolates a P– well 108. Within the P– well 108, an N+ region 110 provides an electrical contact for a programming lead (PL) 112 to the P– well 108, and a P+ region 114 provides an electrical contact for a reading lead (RL) 116 to the P– well 108. A gate dielectric layer (GD) 118 (e.g., silicon dioxide (SiO$_2$) or other dielectric material) is disposed atop the P– well 108. A P+ polysilicon layer 120 and a silicide layer 122 form a gate structure having a gate contact (GC) 124. In some aspects, the gate structure may comprise a metal gate. FIG. 1A shows the OTP bit cell 100 in an unprogrammed state. In this state, the GD 118 is an insulating layer that prevents current from flowing between the GC 124 and the RL 116 at operating voltages. Thus, an unprogrammed OTP bit cell 100 may be referred to as being in a high resistance state.

Figure 1B:
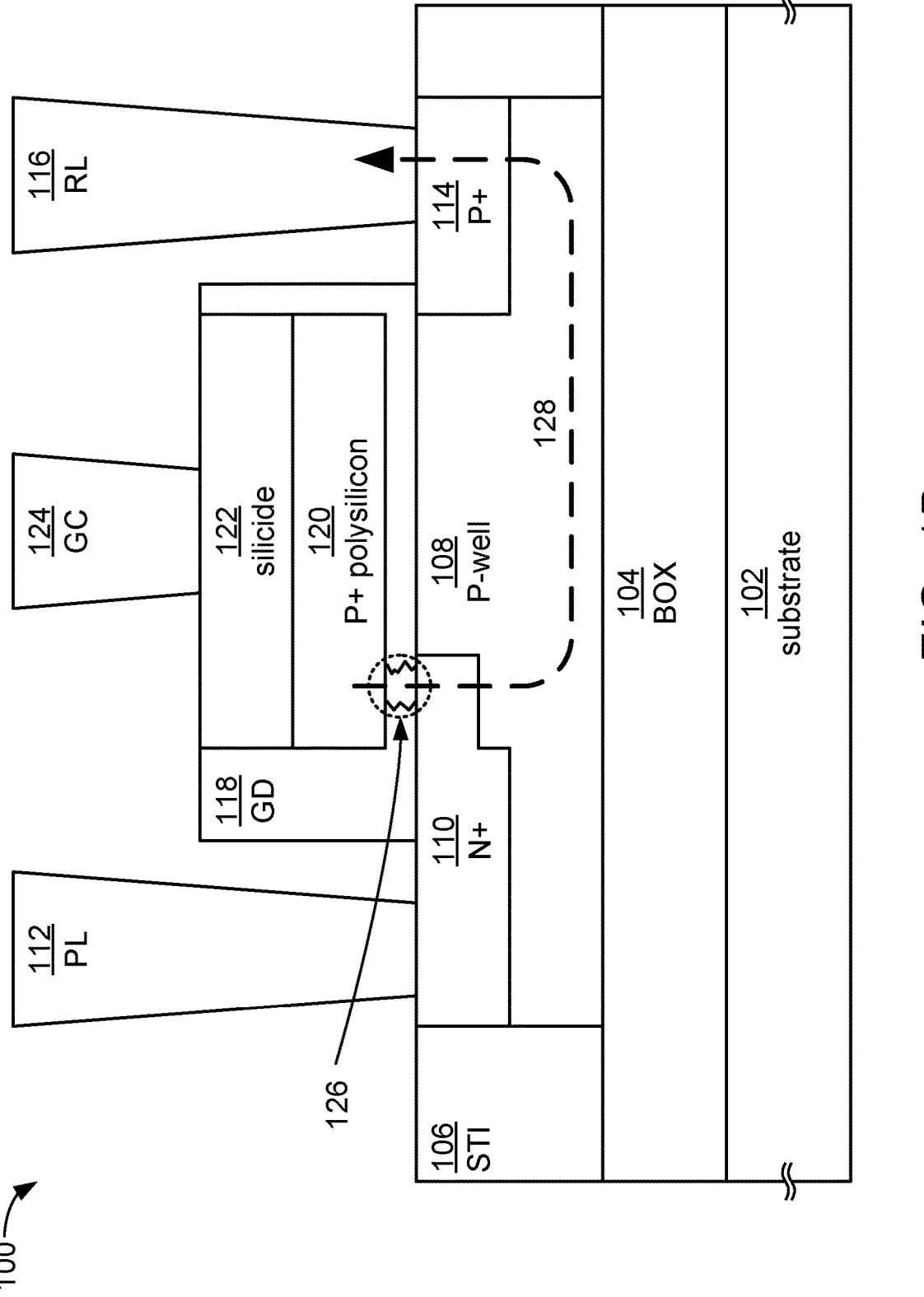
FIG. 1B is a cross-section of the secure anti-fuse OTP bit cell in a programmed state.

FIG. 1B is a cross-section of the secure anti-fuse OTP bit cell 100 after it has been programmed by applying a high bias voltage (which may also be referred to as a programming voltage) between the GC 124 and the PL 112, which causes a rupture 126 in the gate dielectric layer 118 between the N+ region 110 and the gate structure. The rupture 126 allows a current 128 to occur between the GC 124 and the RL 116 at operating voltages. Thus, a programmed OTP bit cell 100 may be referred to as being in a low resistance state. Unlike conventional e-fuse OTP designs, this rupture cannot be mended by reflow of the silicide layer 122, which makes the bit cell 100 more secure than e-fuse OTP designs.

The secure anti-fuse OTP bit cell 100 includes unique P– well and P+ cap structure that uses oxide fusing to change the bit cell's resistance from very high (e.g., megaohms) in the unprogrammed state to very low (e.g., kiloohms) in the programmed state. The layout of the bit cell 100 provides control over the oxide fusing area and the substrate connection area. The OTP bit cells described herein are not susceptible to reprogramming or corruption due to temperature reflow because the dielectric breakdown is destructive and cannot be repaired. OTP bit cell 100 and other OTP bit cells described herein have a P+ polysilicon on a P– well with one or more N+ regions on one side of the polysilicon and one or more P+ regions on the other side of the polysilicon. The N+ regions provide the electrons to burn the dielectric, and once broken, the reading leads can read the resistance between the polysilicon and the P+ region(s). In some aspects, the polysilicon gate can be replaced by metal gates, which makes this design compatible with "gate last" wafer processes. In some aspects, the gate dielectric layer may be SiO$_2$ or high-K gate oxides.

Figure 2:
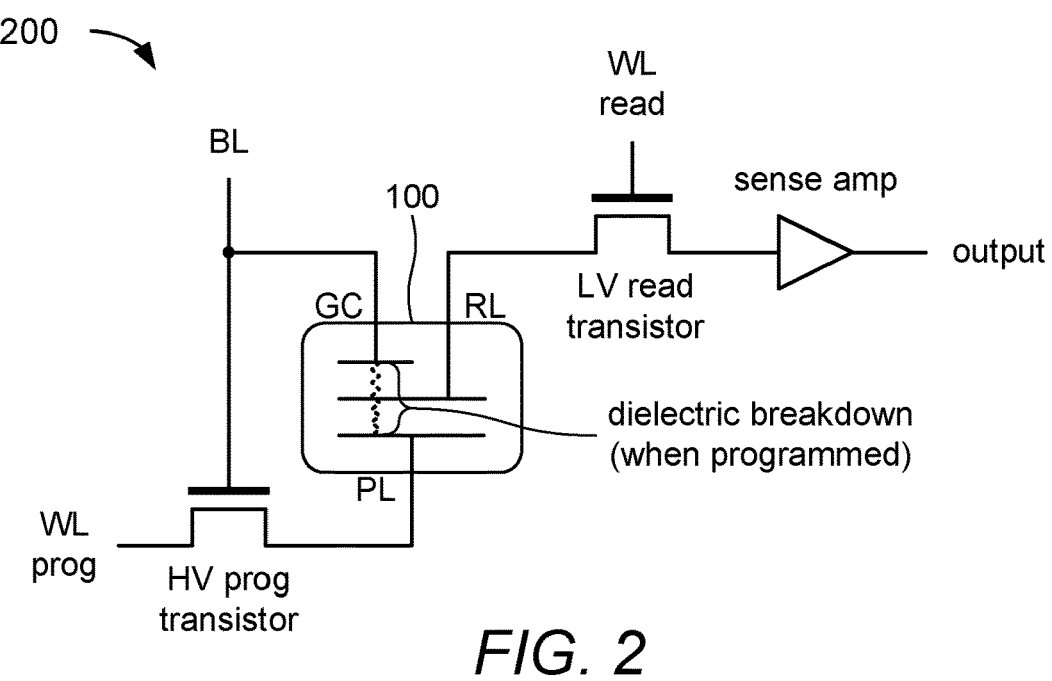
FIG. 2 illustrates an example circuit for using and programming a secure anti-fuse OTP bit cell according to aspects of the disclosure.

FIG. 2 illustrates an example circuit 200 for using and programming a secure anti-fuse OTP bit cell 100 according to aspects of the disclosure. In the example shown in FIG. 2, the circuit 200 includes a high-voltage (HV) programming transistor, a low-voltage (LV) read transistor, and a sense amp.

During programming, Vdd is applied to a bit line (BL), which is connected to the gate contact (GC) of the bit cell 100. Vss is applied to the word line (WL) read line, which is connected to the gate of the LV read transistor, and a programming voltage is applied through the HV programming transistor to the programming lead (PL) of the bit cell 100, which causes a dielectric breakdown (e.g., a short) between the GC and the reading lead (RL).

During a read, Vdd is applied to the BL and the WL read line, and VSS is applied to the PL of the bit cell 100 via the HV programming transistor. If the bit cell 100 is not programmed, there is no short between GC and RL of the bit cell 100, so the voltage at RL, which will be provided to the input to the sense amp via the LV read transistor, will be very low, much less than Vdd. If the bit cell 100 is programmed, the voltage at RL, and thus at the input to the sense amp, will be Vdd.

Figure 3:
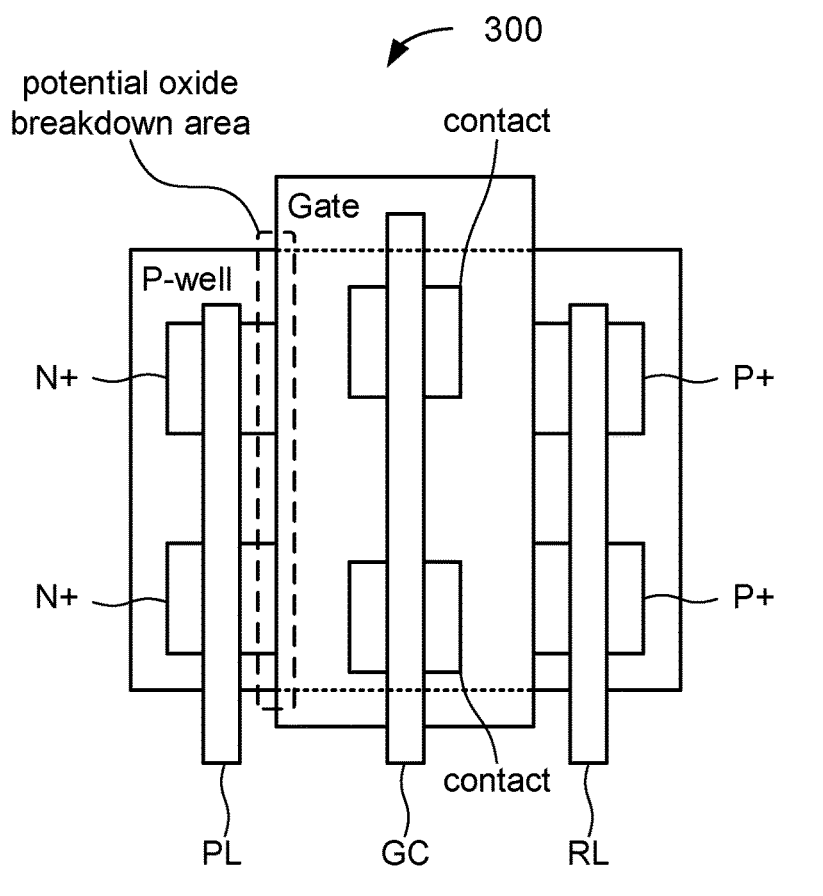
FIG. 3 is a simplified plan view of a layout of a three-terminal secure anti-fuse OTP bit cell according to aspects of the disclosure.

FIG. 3 is a simplified plan view of a layout of a three terminal secure anti-fuse OTP bit cell 300 according to aspects of the disclosure. In the example layout shown in FIG. 3, a P– well contains two N+ regions on the left side and two P+ regions on the right side. The N+ regions and the P+ regions are separated by a gate structure. A PL is connected to the N+ regions, an RL is connected to the P+ regions, and a GC is connected to the gate structure via two contacts. FIG. 3 also illustrates the location of potential oxide breakdown as a result of programming.

Figure 4:
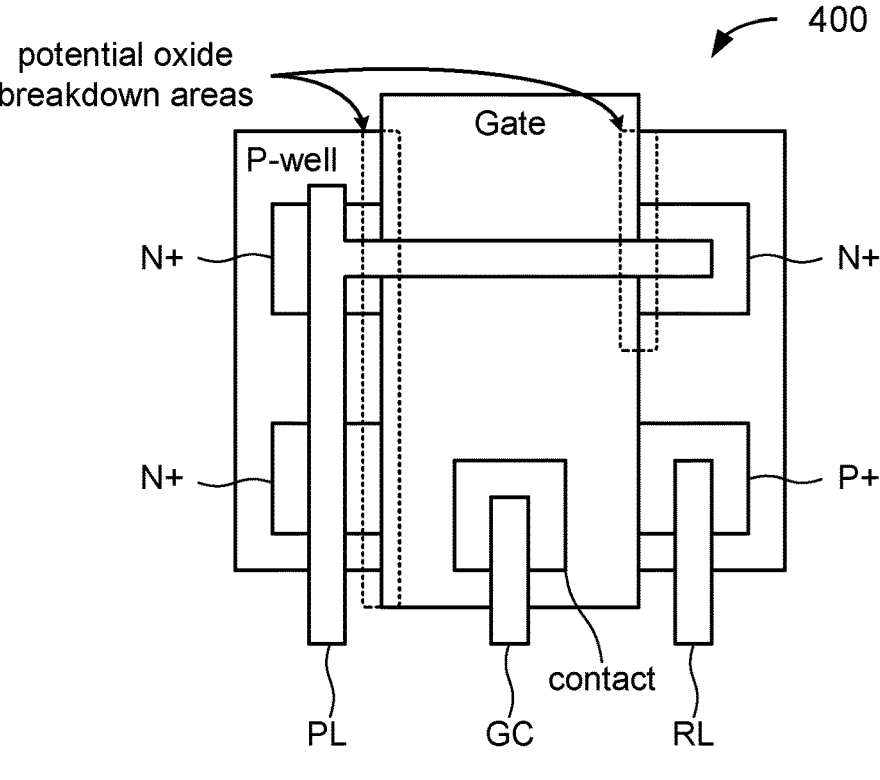
FIG. 4 is a simplified plan view of a layout of another three-terminal secure anti-fuse OTP bit cell according to aspects of the disclosure.

FIG. 4 is a simplified plan view of a layout of another three terminal secure anti-fuse OTP bit cell 400 according to aspects of the disclosure. In the example layout shown in FIG. 4, a P– well contains two N+ regions on the left side and one N+ region on the right side, and one P+ region on the right side. This variant increases the area of potential oxide breakdown compared with the bit cell 300.

Figure 5:
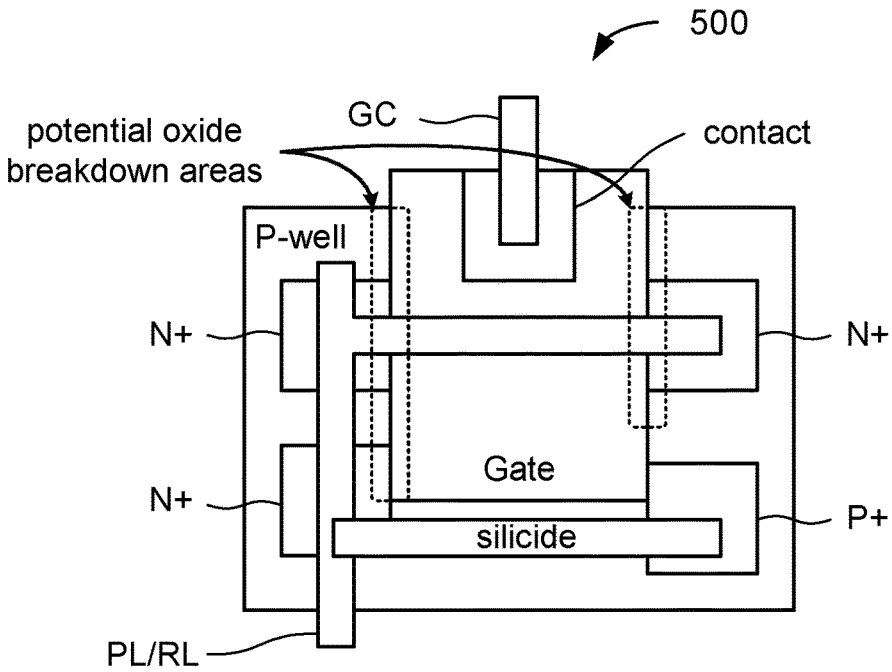
FIG. 5 is a simplified plan view of a layout of a two-terminal secure anti-fuse OTP bit cell according to aspects of the disclosure.

FIG. 5 is a simplified plan view of a layout of a two-terminal secure anti-fuse OTP bit cell 500 according to aspects of the disclosure. FIG. 5 illustrates a two-terminal OTP bit cell, in which a single terminal PL/RL is used both for programming and reading. In some aspects, the single terminal PL/RL is connected not only to one or more N+ regions but also to one or more P+ regions. In the example shown in FIG. 5, the single terminal PL/RL is connected to a P+ region via silicide.

Figure 6:
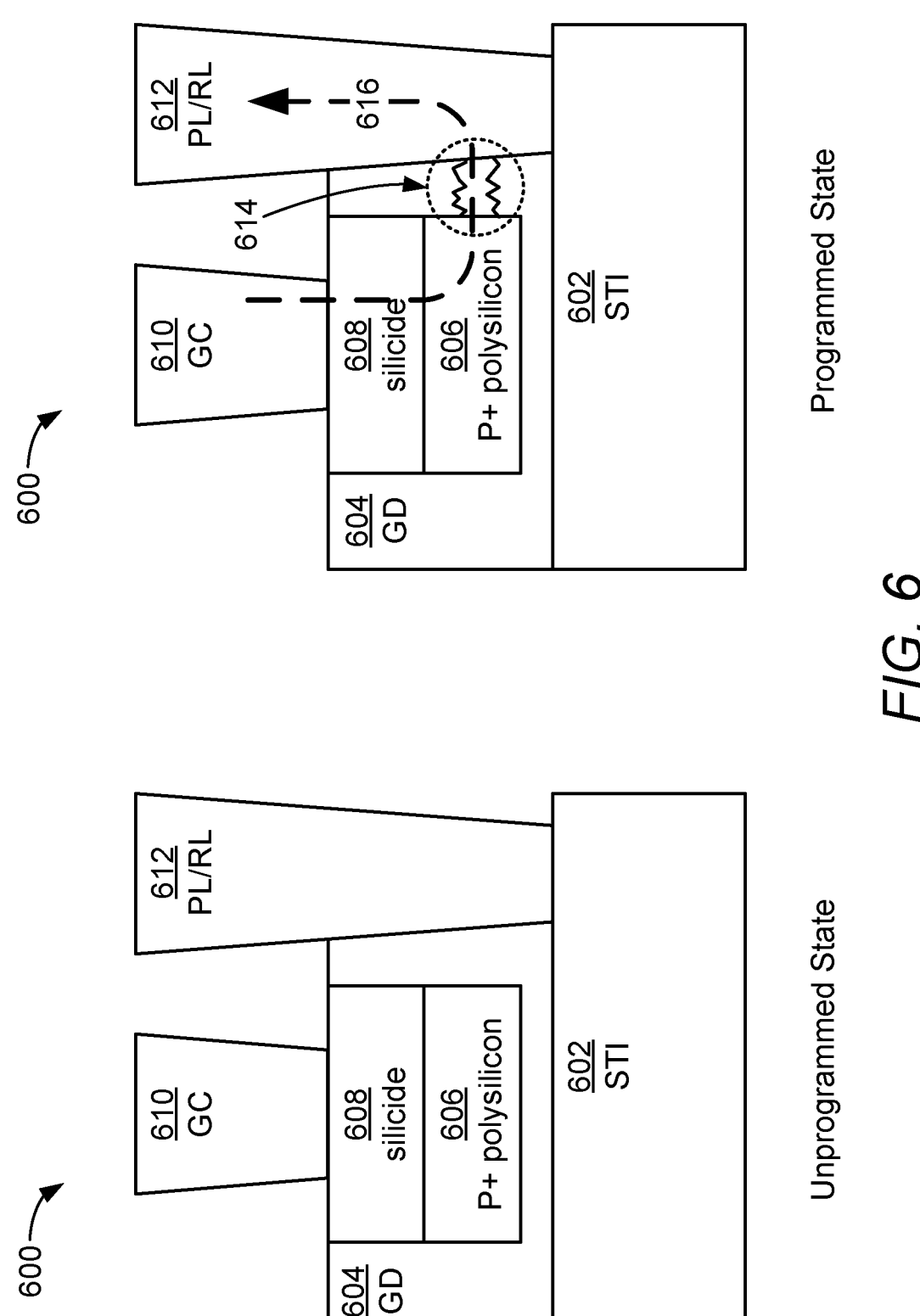
FIG. 6 illustrates cross sections of a two-terminal secure anti-fuse OTP bit cell according to aspects of the disclosure.

FIG. 6 illustrates cross sections of another secure anti-fuse OTP bit cell 600 in the unprogrammed state (left) and the programmed state (right), according to aspects of the disclosure. In the example shown in FIG. 6, STI 602 is topped with a GD 604, with a P+ polysilicon layer 606 and a silicide layer 608 disposed above the STI 602. A GC 610 makes electrical contact with the silicide layer 608 and an RL 612 is disposed above the STI 602 and in contact with the GD 604. In the unprogrammed state, the GD 604 is an insulating layer that prevents current from flowing between the GC 610 and the RL 612 at operating voltages. Thus, an unprogrammed OTP bit cell 600 may be referred to as being in a high resistance state.

The OTP bit cell 600 is programmed by applying a programming voltage between the GC 610 and the RL 612, which causes a breakdown 614 of the GD 604 in the region between the gate structure and the RL 612. The breakdown 614 allows a current 616 to occur between the GC 610 and the RL 612 at operating voltages. Thus, a programmed OTP bit cell 600 may be referred to as being in a low resistance state.

Figure 7:
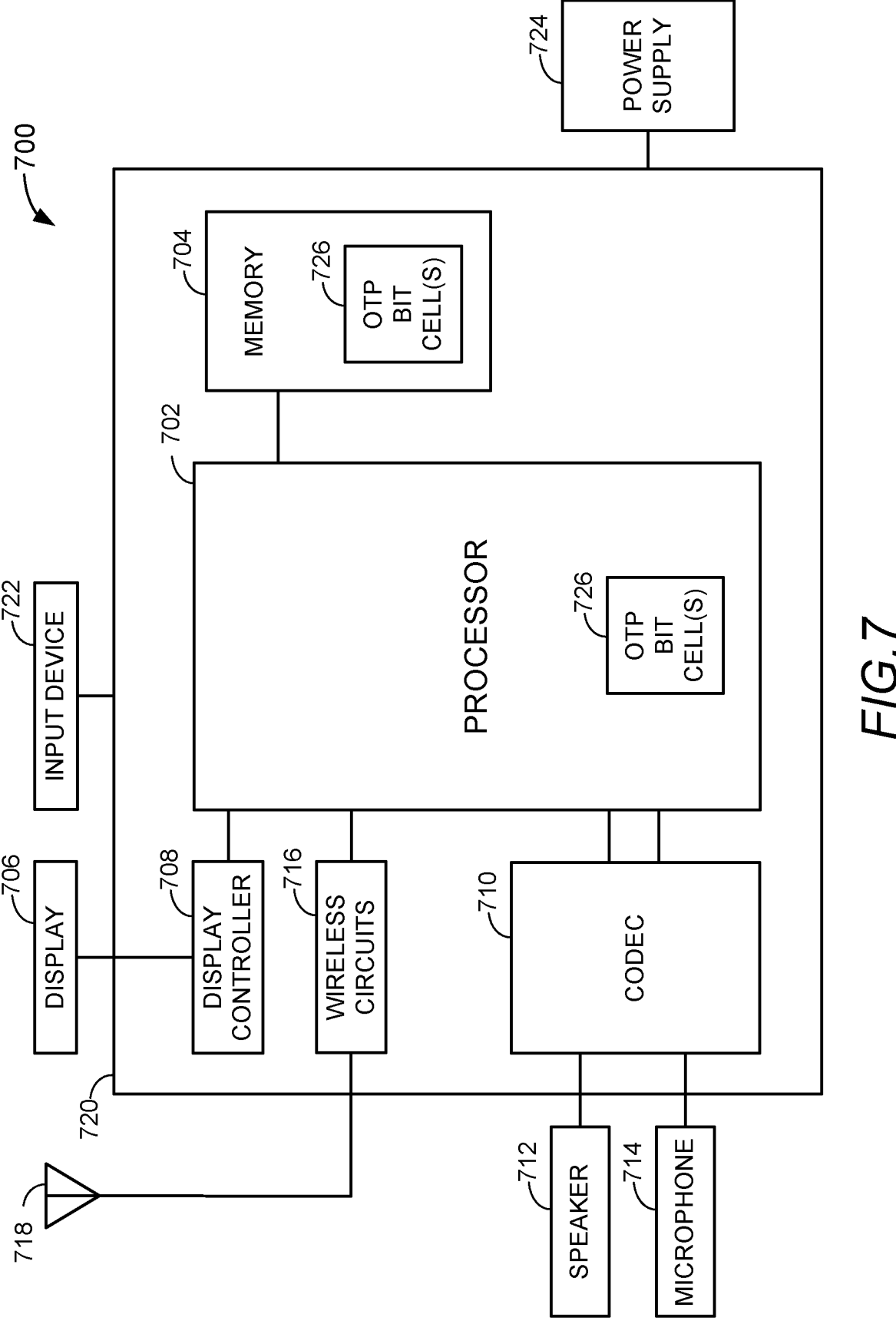
FIG. 7 illustrates an exemplary mobile device in accordance with one or more aspects of the disclosure.

FIG. 7 illustrates an exemplary mobile device in accordance with some examples of the disclosure. Referring now to FIG. 7, a block diagram of a mobile device that is configured according to exemplary aspects is depicted and generally designated mobile device 700. In some aspects, mobile device 700 may be configured as a wireless communication device. As shown, mobile device 700 includes processor 702. Processor 702 may be communicatively coupled to memory 704 over a link, which may be a die-to-die or chip-to-chip link. Mobile device 700 also includes display 706 and display controller 708, with display controller 708 coupled to processor 702 and to display 706.

In some aspects, mobile device 700 may include coder/decoder (CODEC) 710 (e.g., an audio and/or voice CODEC) coupled to processor 702; speaker 712 and microphone 714 coupled to CODEC 710; and wireless circuits 716 coupled to wireless antenna 718 and to processor 702.

In a particular aspect, where one or more of the above-mentioned blocks are present, processor 702, display controller 708, memory 704, CODEC 710, and wireless circuits 716 can be included in a system-in-package or system-on-chip (SoC) device 720. Input device 722 (e.g., physical or virtual keyboard), display 706, speaker 712, microphone 714, wireless antenna 718, and power supply 724 (e.g., battery) may be external to SoC device 720 and may be coupled to a component of SoC device 720, such as an interface or a controller. A secure anti-fuse OTP bit cell 726 according to aspects of the disclosure could be present in the processor 702, memory 704, or any other component within the SoC device 720, for example.

It should be noted that although FIG. 7 depicts a mobile device 700, processor 702 and memory 704 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 8:
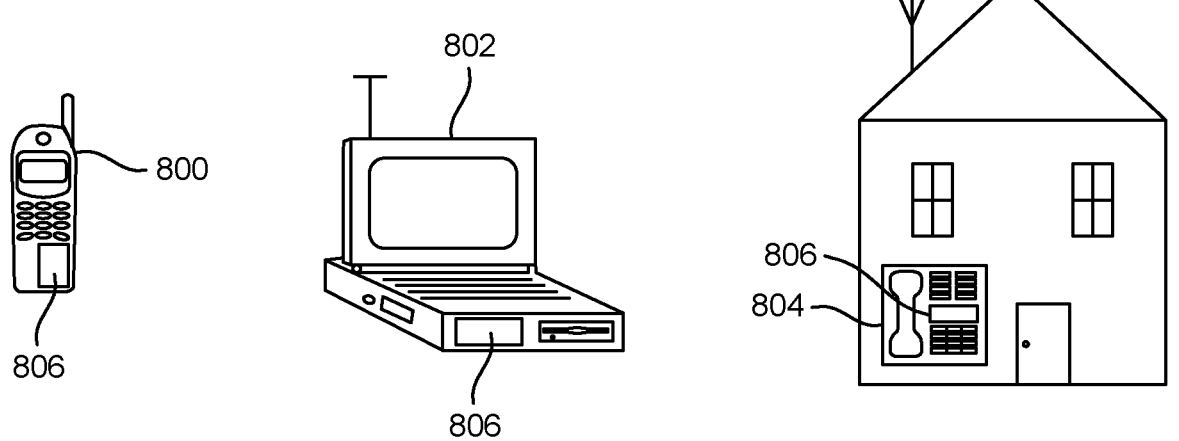
FIG. 8 illustrates various electronic devices in accordance with one or more aspects of the disclosure.

FIG. 8 illustrates various electronic devices that may be integrated with any of the aforementioned integrated device or semiconductor device accordance with various examples of the disclosure. For example, a mobile phone device 800, a laptop computer device 802, and a fixed location terminal device 804 may each be considered generally user equipment (UE) and may include a secure anti-fuse OTP bit cell 806, such as described herein, for example. The mobile phone device 800, laptop computer device 802, and fixed location terminal device 804 illustrated in FIG. 8 are merely exemplary. Other electronic devices may also feature a secure anti-fuse OTP bit cell 806 as described herein, including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

FIG. 9 is a flowchart of an example process 900 associated with fabricating a secure anti-fuse OTP bit cell, according to aspects of the disclosure. As shown in FIG. 9, process 900 may include, at block 910, providing a P– well comprising an N+ region and a P+ region. As further shown in FIG. 9, process 900 may include, at block 920, providing a first contact electrically coupled to the N+ region of the P– well. As further shown in FIG. 9, process 900 may include, at block 930, providing a second contact electrically coupled to the P+ region of the P– well. As further shown in FIG. 9, process 900 may include, at block 940, providing an insulating layer disposed over a portion of the N+ region, a portion of the P– well, and a portion of the P+ region. As further shown in FIG. 9, process 900 may include, at block 950, providing a gate structure disposed over the insulating layer. As further shown in FIG. 9, process 900 may include, at block 960, providing a third contact electrically coupled to the gate structure.

In some aspects, in an unprogrammed mode, the insulating layer creates a high resistance between the third contact and the second contact, and in a programmed mode, a rupture in the insulating layer creates a low resistance between the third contact and the second contact.

In some aspects, providing the insulating layer comprises providing a silicon dioxide (SiO$_2$) layer.

In some aspects, providing the P– well comprises providing a P– well above a buried oxide (BOX) layer.

In some aspects, providing the P– well comprises providing a P– well that is surrounded by a shallow trench isolation (STI) structure.

In some aspects, providing the gate structure comprises providing P+ polysilicon.

In some aspects, providing the gate structure further comprises providing a silicide layer disposed between the P+ polysilicon and the third contact.

Process 900 may include additional implementations, such as any single implementation or any combination of implementations described below and/or in connection with one or more other processes described elsewhere herein. Although FIG. 9 shows example blocks of process 900, in some implementations, process 900 may include additional blocks, fewer blocks, different blocks, or differently arranged blocks than those depicted in FIG. 9. Additionally, or alternatively, two or more of the blocks of process 900 may be performed in parallel.

Figure 10:
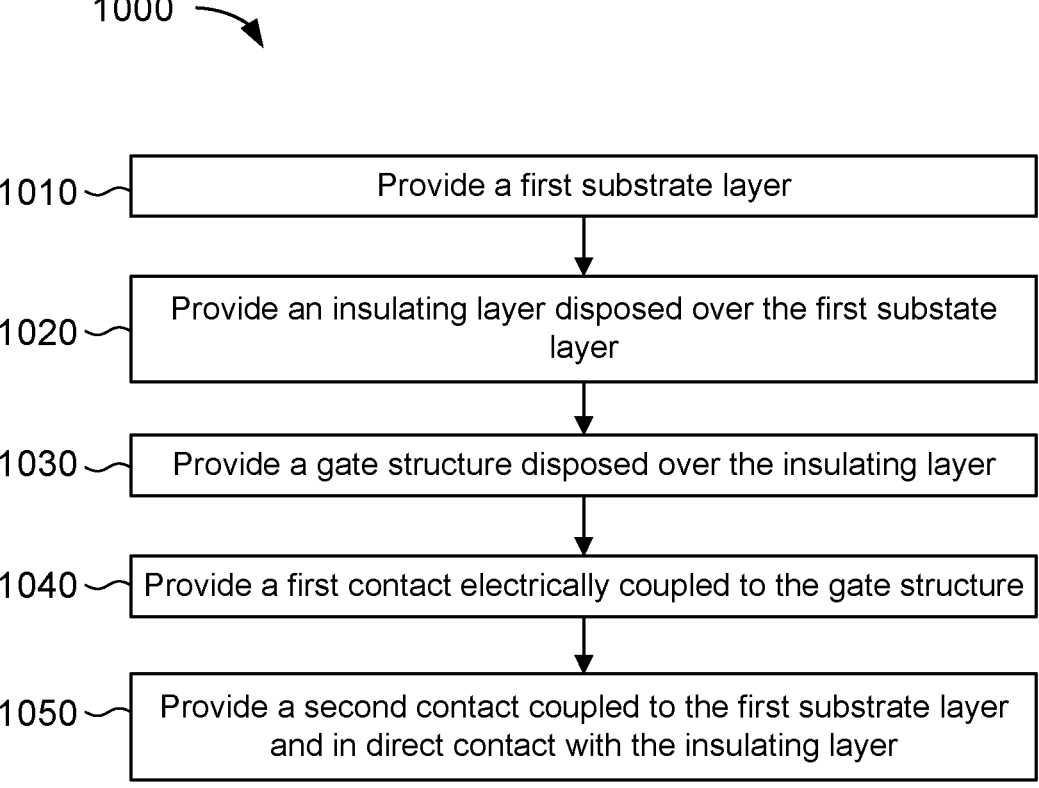
FIG. 10 is a flowchart of an example process associated with fabricating a secure anti-fuse OTP bit cell according to aspects of the disclosure.

FIG. 10 is a flowchart of an example process 1000 associated with fabricating a secure anti-fuse OTP bit cell, according to aspects of the disclosure. As shown in FIG. 10, process 1000 may include, at block 1010, providing a first substrate layer. As further shown in FIG. 10, process 1000 may include, at block 1020, providing an insulating layer disposed over the first substrate layer. As further shown in FIG. 10, process 1000 may include, at block 1030, providing a gate structure disposed over the insulating layer. As further shown in FIG. 10, process 1000 may include, at block 1040, providing a first contact electrically coupled to the gate structure. As further shown in FIG. 10, process 1000 may include, at block 1050, providing a second contact coupled to the first substrate layer and in direct contact with the insulating layer.

In some aspects, in an unprogrammed mode, the insulating layer creates a high resistance between the first contact and the second contact, and in a programmed mode, a rupture in the insulating layer creates a low resistance between the first contact and the second contact.

In some aspects, providing the insulating layer comprises providing a silicon dioxide (SiO$_2$) layer.

In some aspects, providing the first substrate layer comprises providing a buried oxide (BOX) layer or shallow trench isolation (STI) structure.

In some aspects, providing the gate structure comprises providing P+ polysilicon.

In some aspects, providing the gate structure further comprises providing a silicide layer disposed between the P+ polysilicon and the first contact.

Process 1000 may include additional implementations, such as any single implementation or any combination of implementations described below and/or in connection with one or more other processes described elsewhere herein. Although FIG. 10 shows example blocks of process 1000, in some implementations, process 1000 may include additional blocks, fewer blocks, different blocks, or differently arranged blocks than those depicted in FIG. 10. Additionally, or alternatively, two or more of the blocks of process 1000 may be performed in parallel.

The secure anti-fuse OTP bit cells disclosed herein provide various technical advantages. Such technical advantages include, but are not limited to, the following: small layout size/higher density than conventional OTP structures; secure, non-reversible OTP design that is not susceptible to temperature reflow; good control over the oxide fusing area and the substrate connection area; and easily integrated into a front end of line (FEOL) CMOS process flow, which can be performed entirely within a CMOS fabrication facility.

Implementation examples are described in the following numbered clauses:

Clause 1. A one-time programmable (OTP) bit cell, comprising: a P– well comprising an N+ region and a P+ region; a first contact electrically coupled to the N+ region of the P– well; a second contact electrically coupled to the P+ region of the P– well; an insulating layer disposed over a portion of the N+ region, a portion of the P– well, and a portion of the P+ region; a gate structure disposed over the insulating layer; and a third contact electrically coupled to the gate structure.

Clause 2. The OTP bit cell of clause 1, wherein the insulating layer comprises a silicon dioxide (SiO$_2$) layer.

Clause 3. The OTP bit cell of any of clauses 1 to 2, wherein the P– well is disposed above a buried oxide (BOX) layer.

Clause 4. The OTP bit cell of any of clauses 1 to 3, wherein the P– well is surrounded by a shallow trench isolation (STI) structure.

Clause 5. The OTP bit cell of any of clauses 1 to 4, wherein the gate structure comprises P+ polysilicon.

Clause 6. The OTP bit cell of clause 5, wherein the gate structure further comprises a silicide layer disposed between the P+ polysilicon and the third contact.

Clause 7. The OTP bit cell of any of clauses 1 to 6, wherein the first contact is a programming lead, the second contact is a reading lead, and the third contact is a gate contact.

Clause 8. A one-time programmable (OTP) bit cell, comprising: a first substrate layer; an insulating layer disposed over the first substrate layer; a gate structure disposed over the insulating layer; a first contact electrically coupled to the gate structure; and a second contact coupled to the first substrate layer and in direct contact with the insulating layer.

Clause 9. The OTP bit cell of clause 8, wherein the insulating layer comprises a silicon dioxide (SiO$_2$) layer.

Clause 10. The OTP bit cell of any of clauses 8 to 9, wherein the first substrate layer comprises a buried oxide (BOX) layer or shallow trench isolation (STI) structure.

Clause 11. The OTP bit cell of any of clauses 8 to 10, wherein the gate structure comprises P+ polysilicon.

Clause 12. The OTP bit cell of clause 11, wherein the gate structure further comprises a silicide layer disposed between the P+ polysilicon and the first contact.

Clause 13. The OTP bit cell of any of clauses 8 to 12, wherein the first contact is a gate contact and the second contact is a programming and reading lead.

Clause 14. A method of fabricating a one-time programmable (OTP) bit cell, the method comprising: providing a P– well comprising an N+ region and a P+ region; providing a first contact electrically coupled to the N+ region of the P– well; providing a second contact electrically coupled to the P+ region of the P– well; providing an insulating layer disposed over a portion of the N+ region, a portion of the P– well, and a portion of the P+ region; providing a gate structure disposed over the insulating layer; and providing a third contact electrically coupled to the gate structure.

Clause 15. The method of clause 14, wherein providing the insulating layer comprises providing a silicon dioxide ($SiO_2$) layer.

Clause 16. The method of any of clauses 14 to 15, wherein providing the P– well comprises providing a P– well above a buried oxide (BOX) layer.

Clause 17. The method of any of clauses 14 to 16, wherein providing the P– well comprises providing a P– well that is surrounded by a shallow trench isolation (STI) structure.

Clause 18. The method of any of clauses 14 to 17, wherein providing the gate structure comprises providing P+ polysilicon.

Clause 19. The method of clause 18, wherein providing the gate structure further comprises providing a silicide layer disposed between the P+ polysilicon and the third contact.

Clause 20. A method of fabricating a one-time programmable (OTP) bit cell, the method comprising: providing a first substrate layer; providing an insulating layer disposed over the first substrate layer; providing a gate structure disposed over the insulating layer; providing a first contact electrically coupled to the gate structure; and providing a second contact coupled to the first substrate layer and in direct contact with the insulating layer.

Clause 21. The method of clause 20, wherein providing the insulating layer comprises providing a silicon dioxide ($SiO_2$) layer.

Clause 22. The method of any of clauses 20 to 21, wherein providing the first substrate layer comprises providing a buried oxide (BOX) layer or shallow trench isolation (STI) structure.

Clause 23. The method of any of clauses 20 to 22, wherein providing the gate structure comprises providing P+ polysilicon.

Clause 24. The method of clause 23, wherein providing the gate structure further comprises providing a silicide layer disposed between the P+ polysilicon and the first contact.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer, or an electronic circuit. In some examples, some or a plurality of the most important method actions can be performed by such an apparatus.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the example clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an insulator and a conductor). Furthermore, it is also intended that aspects of a clause can be included in any other independent clause, even if the clause is not directly dependent on the independent clause.

The foregoing disclosed packages, devices, and functionalities may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged into a flip-chip or other package. The packages may then be employed in devices described herein.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 1-8 may be rearranged and/or combined into a single component, process, feature or function or incorporated in several components, processes, or functions. Additional elements, components, processes, and/or functions may also be added without departing from the disclosure. It should also be noted that FIGS. 1-8 and corresponding description in the present disclosure are not limited to dies and/or ICs. In some implementations, FIGS. 1-8 and corresponding descriptions may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (POP) device, and/or an interposer.

It should furthermore be noted that methods, systems, and apparatus disclosed in the description or in the claims can be implemented by a device comprising means for performing the respective actions and/or functionalities of the methods disclosed. Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. A one-time programmable (OTP) bit cell, comprising:
a P-well comprising an N+ region and a P+ region;
a first contact electrically coupled to the N+ region of the P−well;
a second contact electrically coupled to the P+ region of the P−well;
an insulating layer disposed over a portion of the N+ region, a portion of the P-well, and a portion of the P+ region;
a gate structure disposed over the insulating layer and comprising a P+ region adjacent to the insulating layer and opposite the insulating layer from at least a portion of the N+ region of the P− well; and
a third contact electrically coupled to the gate structure, wherein the P− well is disposed above an insulating layer comprising a buried oxide (BOX) layer or shallow trench isolation (STI) structure.

2. The OTP bit cell of claim 1, wherein the insulating layer comprises a silicon dioxide (SiO2) layer.

3. The OTP bit cell of claim 1, wherein the P+ region of the gate structure comprises P+ polysilicon.

4. The OTP bit cell of claim 3, wherein the gate structure further comprises a silicide layer disposed between the P+ polysilicon and the third contact.

5. The OTP bit cell of claim 1, wherein the first contact is a programming lead, the second contact is a reading lead, and the third contact is a gate contact.

6. A one-time programmable (OTP) bit cell, comprising:
a first substrate layer comprising an insulating layer comprising a buried oxide (BOX) layer or a shallow trench isolation (STI) structure;
an insulating layer disposed over the first substrate layer;
a gate structure disposed over the insulating layer and comprising a P+region adjacent to the insulating layer;
a first contact electrically coupled to the gate structure; and
a second contact coupled to the first substrate layer and in direct contact with the insulating layer.

7. The OTP bit cell of claim 6, wherein the insulating layer comprises a silicon dioxide (SiO2) layer.

8. The OTP bit cell of claim 6, wherein the P+ region of the gate structure comprises P+ polysilicon.

9. The OTP bit cell of claim 8, wherein the gate structure further comprises a silicide layer disposed between the P+ polysilicon and the first contact.

10. The OTP bit cell of claim 6, wherein the first contact is a gate contact and the second contact is a programming and reading lead.

11. A method of fabricating a one-time programmable (OTP) bit cell, the method comprising:
providing a P− well comprising an N+ region and a P+ region above an insulating layer comprising a buried oxide (BOX) layer or a shallow trench isolation (STI) structure;
providing a first contact electrically coupled to the N+ region of the P− well;
providing a second contact electrically coupled to the P+ region of the P− well;
providing an insulating layer disposed over a portion of the N+ region, a portion of the P− well, and a portion of the P+ region;
providing a gate structure disposed over the insulating layer and comprising a P+ region adjacent to the insulating layer and opposite the insulating layer from at least a portion of the N+ region of the P− well; and
providing a third contact electrically coupled to the gate structure.

12. The method of claim 11, wherein providing the insulating layer comprises providing a silicon dioxide (SiO2) layer.

13. The method of claim 11, wherein providing the P+ region of the gate structure comprises providing P+ polysilicon.

14. The method of claim 13, wherein providing the gate structure further comprises providing a silicide layer disposed between the P+ polysilicon and the third contact.

15. A method of fabricating a one-time programmable (OTP) bit cell, the method comprising:
providing a first substrate layer comprising an insulating layer comprising a buried oxide (BOX) layer or a shallow trench isolation (STI) structure;
providing an insulating layer disposed over the first substrate layer;
providing a gate structure disposed over the insulating layer and comprising a P+ region adjacent to the insulating layer;
providing a first contact electrically coupled to the gate structure; and
providing a second contact coupled to the first substrate layer and in direct contact with the insulating layer.

16. The method of claim 15, wherein providing the insulating layer comprises providing a silicon dioxide (SiO2) layer.

17. The method of claim 15, wherein providing the P+ region of the gate structure comprises providing P+ polysilicon.

18. The method of claim 17, wherein providing the gate structure further comprises providing a silicide layer disposed between the P+ polysilicon and the first contact.

\* \* \* \* \*